United States Patent [19]

Dolbear et al.

[11] Patent Number: 4,993,482
[45] Date of Patent: Feb. 19, 1991

[54] COILED SPRING HEAT TRANSFER ELEMENT

[75] Inventors: Thomas P. Dolbear; Richard D. Nelson; David A. Gibson, all of Austin, Tex.; Omkarnath R. Gupta, Fremont, Calif.

[73] Assignee: Microelectronics and Computer Technology Corporation, Austin, Tex.

[21] Appl. No.: 462,688

[22] Filed: Jan. 9, 1990

[51] Int. Cl.$^5$ ............... F28F 7/00; H02B 1/56; H05K 7/20
[52] U.S. Cl. ................. 165/80.2; 165/185; 361/386; 361/388
[58] Field of Search ............. 165/80.2, 185; 361/386, 361/388

[56] References Cited

U.S. PATENT DOCUMENTS

| 4,156,458 | 5/1979 | Chu et al. | 165/185 |
|---|---|---|---|
| 4,190,106 | 2/1980 | Dunmire et al. | 165/185 |
| 4,263,965 | 4/1981 | Mansuria et al. | 165/80 |
| 4,273,183 | 6/1981 | Altoz et al. | 165/185 |
| 4,448,240 | 5/1984 | Sharon | 165/80 |
| 4,457,360 | 7/1984 | Roose | 165/80 |
| 4,465,130 | 8/1984 | Romania et al. | 165/185 |
| 4,479,140 | 10/1984 | Horvath | 357/81 |
| 4,654,754 | 2/1987 | Daszkowski | 361/388 |
| 4,689,720 | 8/1987 | Daszkowski | 361/386 |
| 4,792,878 | 12/1988 | Buselmeier et al. | 361/383 |

FOREIGN PATENT DOCUMENTS

| 0151068 | 1/1985 | Japan . | |
| 1126079 | 9/1968 | United Kingdom | 165/185 |
| 2146423 | 4/1985 | United Kingdom | 165/80.3 |

OTHER PUBLICATIONS

C. D. Ostergren, "Chip-Cooling Structure", IBM Technical Disclosure Bulletin, Jun. 1982, vol. 25, No. 1, pp. 313-314.

H. Parsapour, "Hook and Loop Thermal Conductive Mesh", IBM Technical Disclosure Bulletin, Feb. 1979, vol. 21, No. 9, p. 3672.

V. Antonetti et al., "Compliant Cold Cooling Plate Scheme", IBM Technical Disclosure Bulletin, Nov., 1978, vol. 21, No. 6, p. 2341.

Author unknown, "New Coating for Radial Finger Cooling", IBM Technical Disclosure Bulletin, May, 1986, vol. 28, No. 12, pp. 5504-5505.

R. Carson et al., "Thermal Expansion Mismatch in Electronic Packaging", Materials Research Symposium Proceedings, 1985, vol. 40, pp. 177-190.

Primary Examiner—John Rivell
Assistant Examiner—L. R. Leo
Attorney, Agent, or Firm—David M. Sigmond

[57] ABSTRACT

A thermally conductive coiled spring laid on its side provides a compliant, high conductive, low force thermal path between a heat source and a heat sink. Each spring contact provides two parallel heat conduction paths via each coil in the spring. The spring can be canted to permit slidable contact with a surface. In one embodiment a plurality of copper springs arranged in parallel can provide a thermal path between an electronic component and a heat sink in close proximity. The springs may be permanently attached to at least one surface at the points of contact.

23 Claims, 2 Drawing Sheets

COILED SPRING HEAT TRANSFER ELEMENT

BACKGROUND OF THE INVENTION

The present invention relates to a thermally conductive element placed between a heat source and a heat sink, and more particularily to a heat conducting coiled spring for cooling electronic components in high density microelectronic packaging applications in which components are mounted on interconnect substrates, heat sinks are positioned in close proximity to the components, and springs laid on their sides are positioned in contact therebetween.

The need to remove heat from densely packed electronic components to prevent overheating is exacerbated by the trend towards higher component density and higher power dissipation. For instance, cooling from the backside of chips that are "flip-chip" or "flip-TAB" bonded to the substrate is usually necessary for packages on thick multilayer boards due to the low thermal conductivity of the electrical interconnect between the chip and the board. For such cooling systems, it becomes necessary to provide a good thermal link between a component and a heat sink such as a cooling plate. Thermal grease has been used for this purpose with the disadvantages that the grease can migrate or dry up with age, resulting in cracks that interfere with heat transfer. Thermal grease problems also arise from air pockets and nonuniform spacing among the heat sources and heat sink.

Suitable liquid coolants have been used for submersing electronic components but this can result in corrosion of both the component and the metallurgy on the substrate.

Cooling pistons have also been used but suffer the drawbacks that interface contact becomes difficult with tilted components, conformal means are usually necessary at the piston end, the components may be damaged by inertial shocks, and even with good contact the thermal efficiency is low.

Another solution used to improve thermal contact is by applying more pressure to force the surfaces together, for instance 100 pounds per module. This is limited by the pressure each individual chip can withstand, which is commonly approximately 1.5 lbs./chip. This also requires an exceptionally rigid heat sink as well as a mechanism to apply and release the pressure so that the components can be maintained or replaced.

It is also known to use thermally conductive particle filled elastomer materials as heat conduction elements. These materials can be thin films cut to fit over the components; however, they require high pressure to compensate for surface irregularities or for nonuniform spacing and therefore require excessive force for multi-chip modules.

The use of solder to improve a thermal contact has also been used. The major disadvantage of hard solders is their rigidity and high cost because of the gold contact Soft solder use is commonplace in semiconductor packaging due to its ease of use and low cost. However, the useful life of soft solder is limited by metallurgical fatigue from propogation of cracks through the solder due to the large deformation that usually occurs whenever the component is turned on and off. In addition, metallurgical bonds make repair and rework of a multi-chip module difficult.

Spring-like elements for thermal conduction between a heat source and a heat sink are also well known. Usually the spring elements provide a compliant contact, but the generally limited contact area often results in high thermal resistance. The use of solder to improve this contact can make the spring member highly rigid. For example, IBM Technical Disclosure Bulletin, Vol. 28, No. 12, pp. 5504–5505 (May, 1986) describes radial finger cooling (RFC) using springs connected at one end to an integrated circuit chip and at the other end to a cap. The Bulletin further indicates RFC does not permit a low enough thermal resistance for advanced future products. U.S. Pat. No. 4,465,130 discloses a wire form heat exchanger element with helical wire wrapped around a metallic retainer plate. This heat exchanger has relatively low compliance, high thermal resistance due to the long thermal conduction path, and limited contact at the surfaces since contact is made along the length of the wire to a flat surface. U.S. Pat. No. 4,689,720 discloses a thermal link via a resilient strip of heat conductive material, but suffers the drawbacks of relatively low contact density and a complex form. The '720 also discloses a thermal link by means of an elastomeric material filled with particles, metal wire, or wire meshes. Elastomers tend to have low thermal conductivities. Additionally, their thermal conductance can decrease after a load is applied since elastomeric materials tend to creep and relax the contact pressure. Finally, U.S. Pat. No. 4,479,140 discloses a thermal conduction bridge element with an axially compressible spring with a bulged central portion. The leaf springs used therein have relatively long thermal conductions paths which tend to lower the thermal conductance.

SUMMARY

It is a general object of the present invention to provide an improved thermal conduction element for conducting heat between a heat source and a heat sink by means of a spring laid on its side therebetween.

Another object of the present invention is to provide a thermal conduction element for electronic components such as integrated circuits mounted on high density interconnect substrates.

Yet a further object of the present invention is to provide a compliant, low force and high thermal conductance element.

A still further object of the present invention is wherein a plurality of springs are used.

Yet a further object of the present invention is wherein the spring comprises a canted pattern of coils thereby permitting slidable contact with at least one surface. The surface coefficient of friction be may reduced by suitable techniques such as polishing or coating with an appropriate material.

A further object of the present invention is wherein a copper or copper-tungsten spring is used.

A still further object of the present invention is wherein the spring is permanently attached to at least one surface.

Yet a further object of the present invention is wherein the compliant spring can remain in contact with surfaces of varying heights, surfaces that are bowed, and surfaces with different thermal expansion properties.

A further object of the present invention is wherein the compliant spring is used in conjunction with a soft metal coating on one or both surfaces to enhance thermal conduction between the surface and the spring.

DETAILED DESCRIPTION OF THE PREFERRED EMBODIMENTS

The present invention discloses the use of a spring laid on its side to provide a compliant, highly thermally conductive, low force thermal interface. Each coil in the spring provides a heat exchange contact with a surface on a heat source and a surface on a heat sink wherein each contact contains two parallel thermal conduction paths. Compliant multiple contacts can be provided for surfaces that contain deviations in flatness. Preferably, a plurality of springs can be densely packed together to maximize contact points along the surfaces. Additionally, if multiple discrete heat sources are to be cooled, the spring compliance can accommodate variance in the positions of these sources perpendicular to the surface being contacted. The dimensions and number of springs used, the type of springs used, the spring material, the method of attachment to the heat source and heat sink, and the details of the contacting surfaces will depend on the thermal and mechanical specifications needed for the application at hand.

Figure 1:
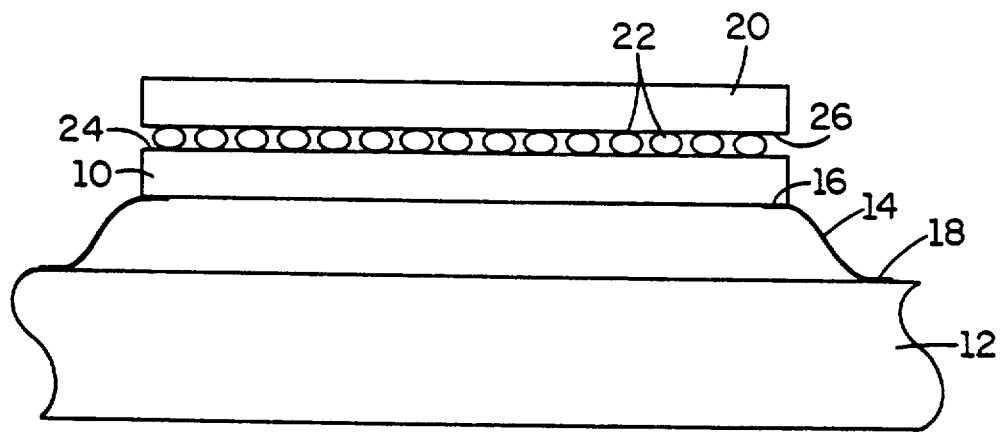
FIG. 1 is a cross-sectional view of an integrated circuit chip mounted on a substrate, a heat sink in close proximity to the chip, and a plurality of thermally conductive springs positioned therebetween to conduct heat from the chip to the heat sink.

Referring now to FIG. 1 the preferred embodiment of the present invention is described for an electronics cooling application. Integrated circuit chip 10 is mounted on substrate 12 by tape-automated-bonding (TAB) leads 14 which form inner lead bonds 16 with connection pads on chip 10 and outer lead bonds 18 with connection pads on substrate 12. Heat sink 20 is mounted above and in close proximity to chip 10. Flexible coiled springs 22 are laid on their sides and positioned between chip back surface 24 and heat sink lower surface 26. The coils of springs 22 have uniformly distributed contact with surfaces 24 and 26 in heat exchange relationship so that in operation heat generated by chip 10 is conducted by springs 22 to heat sink 20 and thereby dissipated. Preferrably springs 22 contain copper or copper-tungsten, and are arranged in parallel to each other.

To ensure an adequate heat exchange contact between springs 22 and unattached surfaces 24 and 26, suitable means for applying a force to the contacts is necessary. This force can be applied, for example, by an upper portion of a package which contains the manifolding necessary for the air or liquid cooling, whatever the case may be. For instance, U.S. Pat. No. 4,758,926 sets forth a package construction that applies a force to the interface between an electronic component and a heat sink. An upper limit on the acceptable force will depend on the thickness of chip 10 and the number and strength of leads 14. For instance, pressures may range from 5 to 50 psi for chips unattached to a substrate and from 100 to 500 psi for chips attached to a substrate. A much larger force can be applied if the chip is protected by a chip carrier or other such packaging. A disadvantage of leaving springs 22 unattached to surfaces 24 and 26 is the possibility that springs 22 may roll out of place when not compressed. One solution is to slightly bow springs 22 along their axis. This may also facilitate the use of pressure contacts at surfaces 24 and 26. Alternatively, springs 22 can be permanently attached to chip surface 24, heat sink surface 26, or both. If used, permanent attachment only to heat sink surface 26 is preferable since this is likely to facilitate assembly as well as rework of substrate 12. Permanent attachment can be accomplished by solder reflow, a brazing operation, or other suitable methods. The advantages of permanent attachment are lower thermal resistance at the contacts and easier subsequent assembly. The disadvantages are possibly reduced thermomechanical reliablilty when exposed to temperature cycling or temperature gradients, and reduced compliance of springs 22 due to stiffening.

The thermal performance of springs 22 may be further enhanced by depositing a metal coating on surfaces 24, 26, or both, wherein the metal coating is soft with respect to the spring. This can improve the thermal conduction at the contacts as a result of plastic deformation in the soft metal coating that will increase the contact area with the spring. For example, if a copper or copper-tungsten spring is used, suitable soft metal coatings include gold, nickel, tin and preferably indium. The thickness of the soft metal coating is preferably in the range of 0.1 to 0.5 mils. Thermal conduction can also be improved by using a soft metal spring, or a spring coated with a soft metal, with respect to a hard surface. But coating the interface surface with a soft metal would be significantly easier to manufacture.

Springs 22 will preferrably provide adequate compliance to ensure a good heat exchange contact between each spring coil and surfaces 24 and 26. Typical values for assembly tolerances are as follows:

| Chip height (above substrate) | +/− 2.5-5.0 mils |
| Chip tilt | +/− 2.1-3.5 mils |
| Chip bow | 0.4 mils/inch |
| Substrate bow | 0.4-4.0 mils/inch |
| Heat sink bow | 0.4-4.0 mils/inch |

For the tolerances listed a spring 22 with 5-10 mils compliance would be suitable; if a 4-inch by 4-inch module were also used then a compliance for spring 22 of 9 mils would be suitable.

Figure 3A:
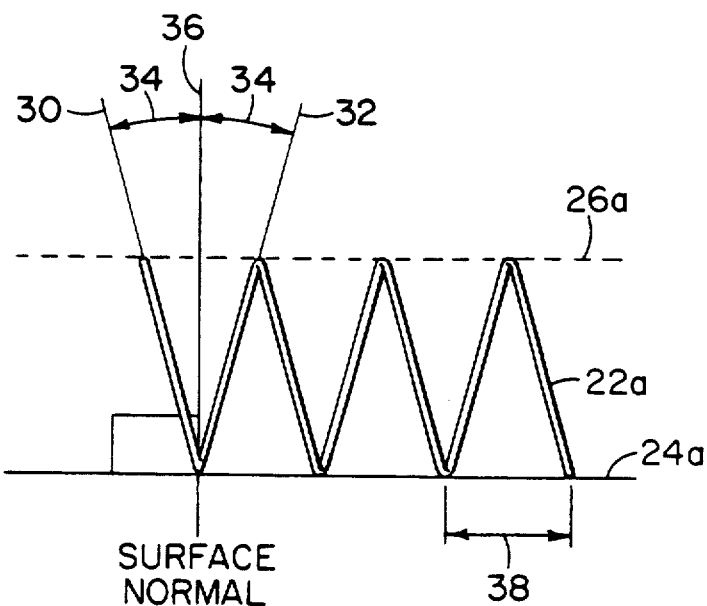
FIG. 3A is a mechanical schematic view of a thermally conductive spring with helical coils.

FIG. 3A illustrates one embodiment of the present invention in which a helical coiled spring 22a is used. Every other half of a coil, shown as first halves 30 and second halves 32, is equally angled at angle 34 to opposite sides of surface normal 36. As force is applied in the direction of surface normal 36, spring 22a will exhibit deforming contact with surfaces 24a and 26a. To provide 10 mils compliance, helical coiled spring 22a can have a coil height of 30-50 mils, a wire diameter of 1-3 mils, and a coil pitch of 3-5 wire diameters.

Figure 2:
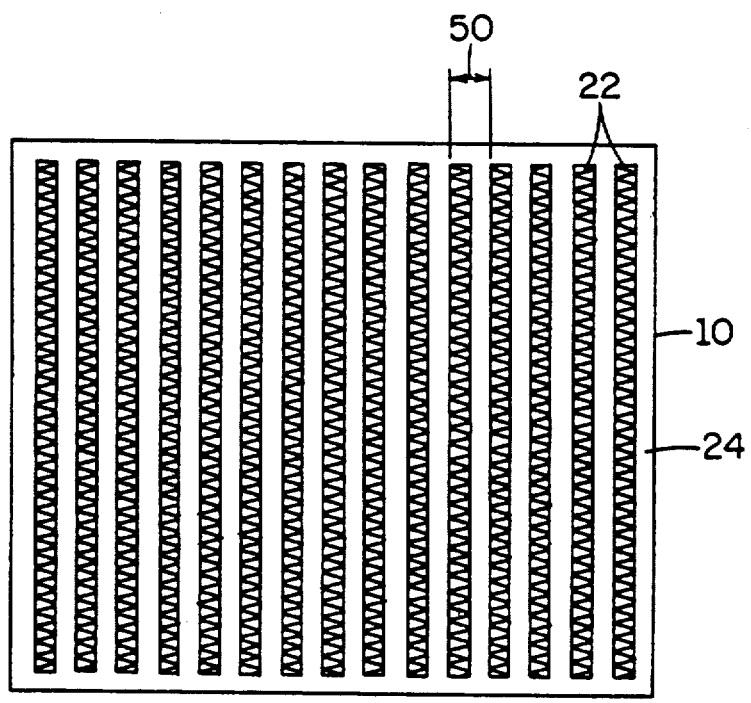
FIG. 2 is a plan view of an integrated circuit chip with a plurality of thermally conductive coiled springs positioned on the chip surface.
Figure 3B:
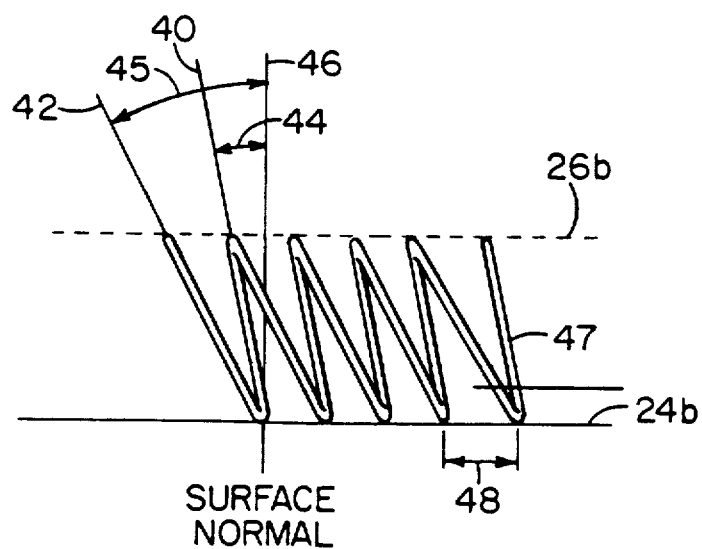
FIG. 3B is a mechanical schematic view of a thermally conductive spring with canted coils.

FIG. 3B illustrates an alternative embodiment to FIG. 3A in which a canted coil spring 22b is used. Canted coil spring 22b has every other half of a coil, shown as first coil halves 40, either in line with surface normal 46 or, as shown, at a slight angle 44 to surface normal 46. The other coil halves, shown as second coil halves 42, are at angle 45 to surface normal 46 wherein angle 45 is greater than angle 44 in the same angular sense, e.g. both half coils 40 and 42 are counterclockwise from surface normal 46. Upon applying a loading force normal to surface 24b, canted coil spring 22b will deflect and slide on surface 24b in the direction of spring axis 47 with minimal bulging perpendicular to spring axis 47 in comparison to the bulging that a deflected helical coiled spring 22a would exhibit. This sliding deflection may further provide a wiping action thereby cleaning contamination from surface 24b and providing contacts with lower thermal resistance. The deflection of canted coil spring 22b is determined by coil angles 44 and 45, the tilt of chip 12, and the coefficient of friction upon surface 24b. Thus angles 44, 45, or both of spring 22b can determine what component of the applied surface normal force is perpendicular and parallel to the contacts at surfaces 24b, 26b, or both, respectively. If predominantly deforming contact is desired then the perpendicular force component can be increased by decreasing angles 44, 45, or both. The force/deflection characteristic of canted coil spring 22b can also be lowered by lowering the coefficient of friction on surface 24b by any suitable surface preparation technique, such as polishing or applying a suitable coating. The axial deflection of canted coil spring 22b allows the pitch 50 between adjacent springs, as best seen in FIG. 2 to be closer than the pitch 50 between adjacent helical springs 22a which would bulge more towards neighboring springs. The 23 axial deflection of canted coil spring 22b can also allow closer coil spacings 48 than helical coil spacing 38. Reduced coil pitch and coil spacing each provide for more contacts with the surfaces and thus lower thermal resistance. Thermal resistance may be increased, however, by the lesser deforming of the coils that occurs at the contacts due to axial deflection. To provide 10 mils compliance canted coil spring 22b can have a coil height of 25–30 mils, a wire diameter of 2–5 mils, and a coil pitch of 1–4 wire diameters.

The present invention is therefore well adapted to carry out the objects and attain the ends and advantages mentioned, as well as others inherent therein. While presently preferred embodiments of the invention have been described for the purpose of disclosure, numerous changes in the details of construction and arrangement of parts can be made without departing from the spirit of the present invention and the scope of the appended claims.

What we claim is:

1. A heat transfer element thermally connecting a heat source and a heat sink comprising:
   a flexible non-toroidal coil spring containing a plurality of canted coils laid on its side between and in heat exchange contact with said heat source and said heat sink,
   said canted coils each comprising first and third adjacent contacts to a first surface and a second contact to a second surface located on a portion of said canted coils between said first and third contacts, so that a surface normal through said second contact on said second surface does not bisect a line segment joining said first and third adjacent contacts on said first surface,
   wherein said coils provide two heat conduction paths at said contacts.

2. The heat transfer element of claim 1 wherein said spring is copper or copper-tungsten.

3. The heat transfer element of claim 1 comprising a plurality of geometrically linear springs.

4. The heat transfer element of claim 3 wherein said geometrically linear springs are copper or copper-tungsten.

5. The heat transfer element of claim 1 wherein said spring is permanently attached to a surface.

6. The heat transfer element of claim 1 wherein said spring is bowed along its axis.

7. The heat transfer element of claim 1 wherein said spring comprises uniformly distributed contacts across the area of said heat source.

8. The heat transfer element of claim 1 wherein said canted spring engages in sliding contact with at least one surface.

9. The heat transfer element of claim 8 wherein said sliding contact further provides a wiping action to clean said surface.

10. The heat transfer element of claim 9 wherein said surface is prepared to lower the coefficient of friction on said surface.

11. The heat transfer element of claim 1 further comprising means for applying force to said contacts.

12. The heat transfer element of claim 1 wherein at least one mating surface is coated with a metal that is soft with respect to said spring in order to improve the thermal conductance between said surface and said spring.

13. The heat transfer element of claim 12 wherein said soft coated metal is selected from the group consisting of gold, nickel, tin, and indium.

14. The heat transfer element of claim 13 wherein said spring is copper or copper-tungsten.

15. The heat transfer element of claim 1 wherein said spring is coated with a metal that is soft with respect to at least one mating surface in order to improve the thermal conductance between said spring and said surface.

16. A heat transfer element thermally connecting a heat source and a heat sink comprising:
   a flexible canted coil spring containing a plurality of canted coils laid on its side between and in heat exchange contact with said heat source and said heat sink,
   wherein said canted coils provide two heat conduction paths at said contacts,
   wherein said canted spring engages in sliding contact with at least one surface and provides a wiping action to clean said at least one surface, and
   said at least one surface is prepared to lower the coefficient of friction on said at least one surface.

17. The heat transfer element of claim 16 wherein said at least one surface is prepared by polishing said at least one surface.

18. The heat transfer element of claim 16 wherein said at least one surface is prepared by coating said at least one surface with an appropriate material.

19. A heat transfer element thermally connecting a heat source and a heat sink comprising:
   a flexible non-toroidal coil spring containing a plurality of canted coils laid on its side between and in heat exchange contact with said heat source and said heat sink,
   said canted coils each comprising first and third adjacent contacts to a first surface and a second contact to a second surface located on a portion of said canted coils between said first and third contacts, so that a first line segment joining said first contact on said first surface to said second contact on said second surface forms a first angle with a surface normal to said second surface at said second contact, a second line segment joining said third contact on said first surface to said second contact on said second surface forms a second angle with said surface normal, and said second angle is greater than said first angle in the same angular sense, wherein said coils provide two heat conduction paths at said contacts.

20. The heat transfer element of claim 19 comprising a plurality of geometrically linear springs arranged in parallel and closely positioned side by side.

21. The heat transfer element of claim 19 wherein said canted spring engages in sliding contact with at least one surface.

22. The heat transfer element of claim 19 wherein said canted spring provides a wiping action to clean at least one surface.

23. The heat transfer element of claim 19, wherein
said canted spring engages in sliding contact with at least one surface,
said canted spring provides a wiping action on said at least one surface, and
said at least one surface is prepared to lower the coefficient of friction on said at least one surface.

* * * * *